(12) United States Patent
Tobin et al.

(10) Patent No.: US 6,297,173 B1
(45) Date of Patent: Oct. 2, 2001

(54) PROCESS FOR FORMING A SEMICONDUCTOR DEVICE

(75) Inventors: Philip J. Tobin; Rama I. Hegde; Hsing-Huang Tseng; David O'Meara; Victor Wang, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/383,238

(22) Filed: Aug. 26, 1999

Related U.S. Application Data

(60) Division of application No. 08/963,463, filed on Nov. 3, 1997, now Pat. No. 5,972,804, which is a continuation-in-part of application No. 08/906,509, filed on Aug. 5, 1997.

(51) Int. Cl.[7] .................................................. H01L 21/31
(52) U.S. Cl. ........................ 438/778; 438/287; 438/791
(58) Field of Search ..................................... 438/287, 591, 438/791, 792, 778, 786, 770, 775, 793

(56) References Cited

U.S. PATENT DOCUMENTS

| | | | |
|---|---|---|---|
| 3,590,337 | 6/1971 | Wegner | 317/234 R |
| 3,629,088 | 12/1971 | Moberg et al. | 204/192 |
| 3,765,935 | 10/1973 | Rand et al. | 117/201 |
| 4,114,254 | 9/1978 | Aoki et al. | 27/571 |
| 4,176,372 | 11/1979 | Matsushita et al. | |
| 4,675,264 | 6/1987 | Kawamura et al. | 430/65 |
| 4,717,631 | 1/1988 | Kaganowicz et al. | 148/33.3 |
| 4,788,082 | 11/1988 | Schmitt | 427/248.1 |
| 4,907,064 | 3/1990 | Yamazaki et al. | |
| 4,961,103 | 10/1990 | Saitoh et al. | |
| 4,980,307 | 12/1990 | Ito et al. | |
| 5,130,267 | 7/1992 | Kaya et al. | |
| 5,168,343 | 12/1992 | Sakamoto | 257/513 |
| 5,198,392 | 3/1993 | Fukuda et al. | |
| 5,210,047 | 5/1993 | Woo et al. | |
| 5,256,205 | 10/1993 | Schmitt, III et al. | 118/723 |
| 5,268,069 | 12/1993 | Chapple-Sokol | 156/646 |
| 5,395,771 | 3/1995 | Nakato | |
| 5,407,870 | 4/1995 | Odada et al. | |
| 5,464,783 | 11/1995 | Kim et al. | |
| 5,529,937 | 6/1996 | Zhang et al. | |
| 5,587,344 | 12/1996 | Ishikawa | |
| 5,691,228 | 11/1997 | Ping et al. | |
| 5,780,891 | 7/1998 | Kauffman et al. | 257/316 |
| 5,808,335 | 9/1998 | Sung | 257/306 |
| 5,968,611 | * 10/1999 | Kaloyeros et al. | 438/791 |

OTHER PUBLICATIONS

Lau, et al. "Stability of Electrical Properties of Nitrogen-Rich, Silicon-Rich and Stoichiometric Silicon Nitride Films", Journal of Applied Physics, vol. 66, pp. 2765-2767 91989).

Jousse, et al., "Investigation of thr light-Induced Effects in Nitrogen-Rich Silicon Nitride Films", Applied Physics Letter 55 (11), pp. 1112-1114 (1989).

* cited by examiner

*Primary Examiner*—Tuan H. Nguyen
(74) *Attorney, Agent, or Firm*—George R. Meyer; Robert A. Rodriguez

(57) ABSTRACT

A method for forming an oxynitride gate dielectric layer (202, 204) begins by providing a semiconductor substrate (200). This semiconductor substrate is cleaned via process steps (10–28). Optional nitridation and oxidation are performed via steps (50 and 60) to form a thin interface layer (202). Bulk oxynitride gate deposition occurs via a step (70) to form a bulk gate dielectric material (204) having custom tailored oxygen and nitrogen profile and concentration. A step (10) is then utilized to in situ cap this bulk dielectric layer (204) with a polysilicon or amorphous silicon layer (208). The layer (208) ensures that the custom tailors oxygen and nitrogen profile and concentration of the underlying gate dielectric (204) is preserved even in the presence of subsequent wafer exposure to oxygen ambients.

21 Claims, 12 Drawing Sheets

PROCESS FOR FORMING A SEMICONDUCTOR DEVICE

RELATED APPLICATION

This is a divisional of U.S. patent application Ser. No. 08/963,463 filed Nov. 3, 1997, now U.S. Pat. No. 5,972,804, which is a continuation-in-part of U.S. patent application Ser. No. 08/906,509 filed Aug. 5, 1997, now abandoned, which is assigned to the current assignee hereof.

FIELD OF THE INVENTION

The present invention relates generally to semiconductor manufacturing, and more particularly to, making a silicon nitride with a tailored oxygen profile for use as a gate dielectric.

BACKGROUND OF THE INVENTION

In the integrated circuit (IC) industry, the performance of metal oxide semiconductor (MOS) field effect transistors (FETs) are controlled by two primary device characteristics. The performance of a MOSFET device can be enhanced by reducing the length of a gate electrode of the MOSFET device, and/or reducing the gate dielectric thickness of the MOSFET device. The integrated circuit industry has progressed to a point where thermal gate oxide thickness is becoming less than roughly 60 angstroms. As gate dielectrics progress to a thickness less than 60 angstroms, a theoretical and practical limit to thermal gate oxidation is now being approached. Therefore, the integrated circuit industry is attempting to develop materials which can replace thermal oxides as gate dielectric materials in order to continue to progress the performance of MOS transistors to new levels.

For this purpose, silicon nitride ($Si_xN_y$) materials have been proposed as a potential gate dielectrics to replace thermal oxide gate dielectrics. Since the dielectric constant of silicon nitride material is roughly twice that of thermal oxide (8.0 versus 4.0), a thicker silicon nitride layer can be physically deposited while achieving a similar equivalent oxide thickness (EOT) of a thinner thermal oxide gate dielectric. For the purpose of illustration, a silicon nitride gate dielectric deposited to a thickness of roughly 80 angstroms is roughly equivalent to a thermal oxide gate dielectric deposited to a thickness of 40 angstroms in terms of MOSFET performance whereby thinner EOT are more advantageous to MOSFET performance. This physical increase in gate dielectric thickness while maintaining similar levels of EOT/performance is advantageous since the physically thicker nitride layer can reduce gate to channel leakage current while MOSFET performance is not adversely impacted.

A first prior art silicon nitride solution for gate dielectric formation utilizes a low pressure chemical vapor deposited (LPCVD) silicon nitride material. As an alternative to this technique, rapid thermal chemical vapor deposition (RTCVD) silicon nitride films have also been proposed for use to replace thermal gate oxides. The use of these LPCVD and RTCVD silicon nitride layers as gate dielectrics is not advantageous. First, these silicon nitride layers suffer from high hydrogen concentrations which result in significant electron trapping which adversely effects MOSFET threshold voltages ($V_t$). It has been experimentally observed that these LPCVD silicon nitride and RTCVD silicon nitride layers experience unstable capacitance-voltage (C-V) performance and unstable current-voltage (I-V) performance. Furthermore, these silicon nitride films are readily oxidized in an oxygen-containing ambient wherein this oxidation will occur in a highly uncontrollable fashion. Since this oxygen concentration controls the relative permittivity ($e_r$) of the material and thereby controls the performance of the MOS device, this uncontrolled oxidation of the silicon nitride layer is disadvantageous and causes radically different MOSFET performance wafer-to-wafer and lot-to-lot.

Another solution proposed in the art is to utilize LPCVD or RTCVD silicon nitride layers which are exposed to a rapid thermal processing (RTP) post-anneal process utilizing $N_2O$, While this post-anneal solution results in MOSFETs with a more stable capacitance-voltage (C-V) performance and a more stable current-voltage (I-V) performance, the oxidation of these layers still remains as a disadvantage. The uncontrolled oxidation of exposed post-annealed nitride layers results in a significant lowering of the material's dielectric constant thereby reducing transistor performance by increasing the EOT value. Dielectric constants on the order of $e_r$=4.7 have been measured for these nitride materials whereby this dielectric constant is not a great improvement over the existing thermal oxide dielectric constant of roughly $e_r$=4.0.

Another solution in the integrated circuit (IC) industry has been to form a silicon nitride layer by direct nitridation of the exposed Si of the channel region of a MOSFET using an ammonia ($NH_3$) ambient. This method also suffers from ambient oxidation of the nitride after film formation, whereby the dielectric constant ($e_r$) of the completed gate dielectric film can be adversely affected as previously discussed. Furthermore, the thickness of material which can be nitrided using this nitridation process is inherently self-limiting whereby adequately thick gate dielectric materials cannot be formed using this process. While plasma processing may allow for the formation of thicker gate oxides using this process, the ambient oxidation of this film is still a limiting factor in the use of this technology.

Another proposed solution to this gate dielectric problem has been membrane dielectric technology. While this technology forms stable MOS transistors have stable CV performance and IV performance, the significant oxygen concentration of these membrane dielectrics adversely affects the dielectric constant whereby MOSFET performance is also adversely impacted.

Jet vapor deposition (JVD) of silicon nitride materials has been proposed for use as gate dielectrics for MOSFETs. While these materials form stable MOSFETs having stable C-V performance and stable I-V performance, the oxygen contamination of these JVD materials is high. Experimentation has shown significant ambient oxidation of the silicon nitride surface after deposition whereby dielectric constants ($e_r$) for these materials are typically less than the dielectric constant of unoxidized silicon nitride materials.

Therefore, the need exists for a new high-K material which does not suffer from reduced C-V and I-V performance and is not adversely oxidized by oxygen-containing ambients. This new gate dielectric should have some oxygen that is selectively formed near the interface to silicon materials to provide the necessary oxygen to create a quality gate dielectric film. In addition, this new gate dielectric must avoid the uncontrolled oxidation found in the prior art when the prior art is exposed to an oxygen ambient. Substantial gate dielectric oxidation needs to be avoided so that the resulting permittivity of the gate dielectric material is not adversely reduced whereby MOSFET performance (i.e. gate leakage current) is affected. In addition, bulk oxygen profiles and concentrations of this new gate dielectric should be low enough and stable enough over time to avoid degradation of the dielectric constant ($e_r$). This gate dielectric will enhance MOS transistor performance over conventional thermal gate dielectric layers and other known nitride gate dielectric solutions.

Silicon dioxide is typically used for gate oxides due to the fact that it can be relatively easily formed and has well known properties and a high quality interface with silicon. However, as devices continue to be scaled to smaller dimensions, the thickness of a silicon dioxide layer becomes too small to make a robust gate dielectric film. Therefore nitride and nitride-like layers are being examined because they have higher dielectric constants compared to silicon dioxide. However, problems can occur when forming the nitride compounds. More specifically, conventional LPCVD depositions of silicon nitride form a layer that has a relatively high amount of electron traps due to a low nitrogen to silicon atomic ratio and a high hydrogen content. Also, the atomic ratio of nitrogen to silicon in the deposited film is essentially constant over a wide range of ammonia to dichlorosilane gas flow ratios. Conventional LPCVD are lengthy processes because of a low deposition rate coupled with lengthy heat up and cool down times. Additionally, conventional LPCVD processing may have adverse effects on the electrical characteristics of the device being formed.

One attempt to address the problem would be to replace a dichlorosilane with a fully chlorinated silane compound. The more chlorinated the silane compound is, generally, the higher the temperature for the deposition. High temperature deposition should be avoided as these can move critical implants that have already been formed within the device including threshold adjusting type implants and punch-through implants.

Yet another way of trying to address the problem is to use a nitrogen-rich silicon nitride film that is formed by either a plasma-enhanced deposition or with implantation. The plasma processing typically uses silane as the source gas and will incorporate a large amount of hydrogen in the bulk. The plasma also causes plasma damage to devices during the film deposition. In yet another alternative embodiment, a conventional silicon nitride layer can be deposited followed by an implantation of nitrogen. However, this is not a good alternative as the implant will cause damage to the film. Further, it will be difficult to control the depth of the nitrogen particularly as the silicon nitride thickness becomes thinner. The nitrogen needs to be spread uniformly throughout the thickness and in almost all instances there will be at least portions of the film near its two outermost surfaces that will be deficient in nitrogen concentration. Although an anneal step can be performed after the implantation or plasma deposition, it is believed that the anneal step will not completely repair the damage that occurs.

The problems related to hydrogen within the silicon nitride film generally have to do with traps. Hydrogen related traps in the bulk increase the leakage current of the film. Traps are generally portions of an interface or layer that has dangling bonds. Traps generally are not desired and should be avoided if possible.

Figure 1:
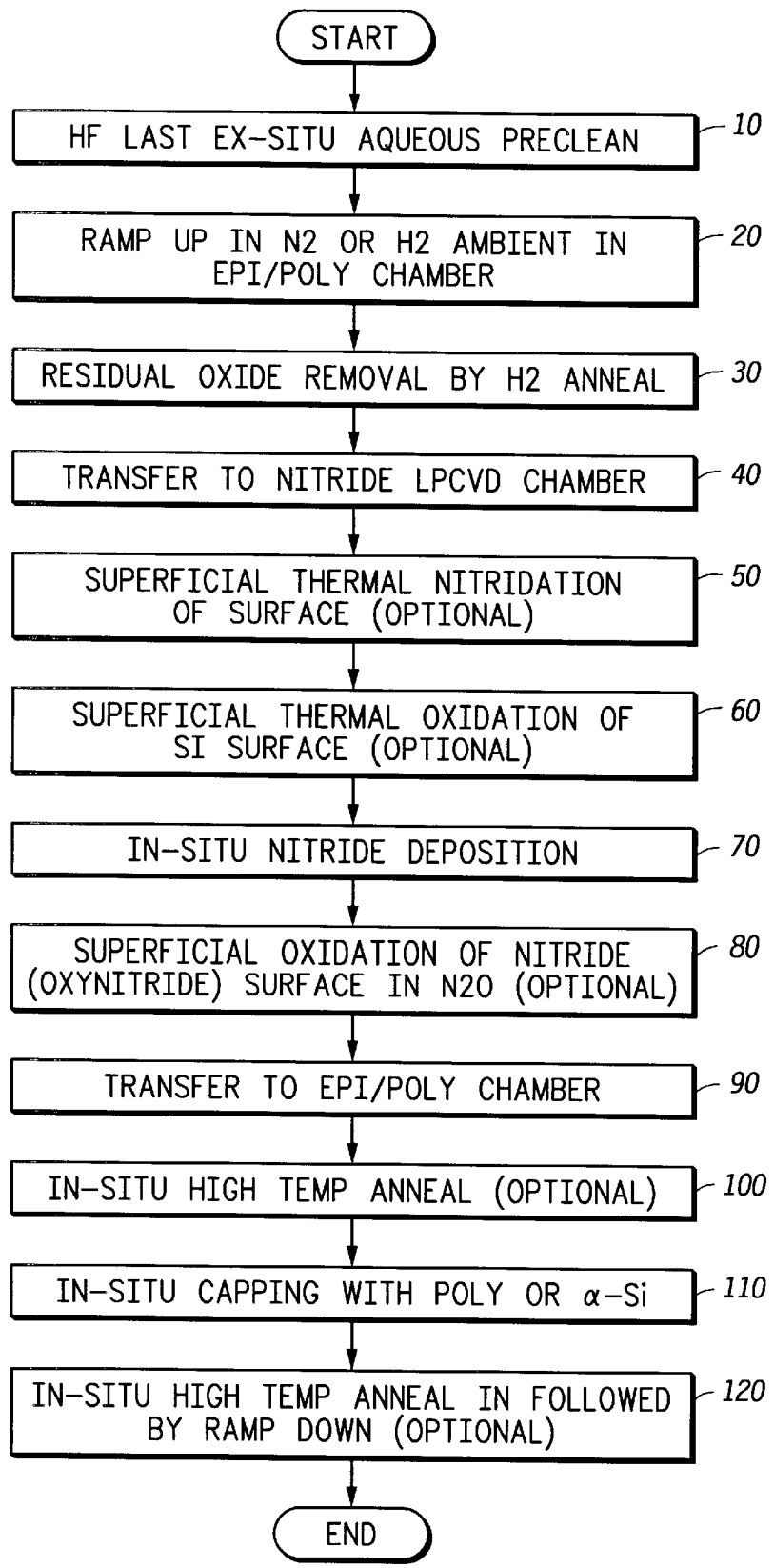
FIG. 1 illustrates, in a flow chart, a process for forming an improved gate dielectric material in accordance with the present invention.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

Generally, the present invention is a method for forming a high-K oxynitride gate dielectric which has a controlled/tailored oxygen concentration and a controlled/tailored oxygen profile therethrough. This tailored oxygen profile and concentration is not adversely affected by subsequent room ambients due to in situ capping of the oxynitride gate dielectric via an in situ conductive gate electrode layer.

The initial oxygen concentration and controlled oxygen profile of this oxynitride gate dielectric is first enabled by performing a semiconductor substrate pre-clean of the semiconductor substrate surface in a hydrogen-containing ambient. This pre-clean ensures that oxygen contamination at a surface of the semiconductor substrate is controlled and/or minimized. An optional semiconductor substrate interface layer is then formed at the surface of the semiconductor substrate wherein this optional interface is controllably formed to contain a predetermined amount of nitrogen and/or oxygen via controlled exposure of the semiconductor substrate to one of either a nitrogen-containing ambient such as ammonia or nitric oxide and/or an oxygen-containing gas, such as nitrous oxide.

After this optional controlled interface is formed, the bulk of the gate dielectric material is formed. The bulk of the gate dielectric material is preferably formed by performing low pressure chemical vapor deposition (LPCVD) of a silicon nitride film using a silane or dichlorosilane and ammonia gas flow. During the silane or dichlorosilane (DCS) and ammonia gas flow, a controlled nitrous oxide gas flow is also provided to allow the silicon nitride film to be doped with some concentration and profile of oxygen to form an oxynitride film. The nitrous oxide gas flow is altered in a controllable manner throughout some time period of the gate dielectric deposition to create an desired oxygen profile and a desired oxygen concentration through the bulk depth of the oxynitride gate dielectric layer. It should be noted that other Si containing gases may be used instead of silane and dichlorosilane.

After the formation of this bulk oxynitride gate dielectric film, optional oxidation of a top surface of the bulk material may be performed. An in situ polysilicon or amorphous silicon (a-Si) capping layer (conductive cap) is then formed over the bulk oxynitride layer to protect the oxygen profile and concentration of the oxynitride from subsequent change and enable the pattering of subsequent gate electrodes for MOS transistors. The main purpose of in situ capping the oxynitride gate dielectric with a silicon-containing layer or conductive gate layer that is a barrier to oxygen is so that the oxygen profile and oxygen concentration of the underlying gate dielectric is not adversely altered by subsequent exposure to room ambients or to oxygen-containing processing environments (e.g., $O_2$ plasma processing). In addition, a high temperature argon (Ar) or nitrogen ($N_2$) anneal may be used either before the polysilicon cap formation or after the polysilicon cap formation in order to reduce a hydrogen concentration within the gate dielectric structure.

The result is a dielectric layer having a vertically tailored oxygen profile and a vertically tailored oxygen concentration wherein this oxygen profile and concentration is protected from subsequent damage due to subsequent processing environments. The resulting gate dielectric layer taught herein has a high dielectric constant ($e_r$) typically ranging from between 5.0 and 8.0 depending upon the desired oxygen profile and concentration added to the nitride gate dielectric film. The physical thickness of this oxynitride gate dielectric material is typically between 25 angstroms and 100 angstroms whereby the effective oxide thickness (EOT) of this material is roughly between 12 angstroms and 50 angstroms. The in situ capping of the gate dielectric ensures that subsequent oxidation of the gate dielectric is avoided whereby the long term MOS performance enhancing properties of the oxynitride gate dielectric are preserved. In addition, the process taught herein ensures that oxygen is still selectively provided within the gate dielectric at critical points whereby device quality of the oxide is improved. Furthermore, the use of the gate dielectric taught herein will reduce the gate-electrode-to-channel-region leakage current whereby lower power devices can be manufactured while high speeds of operation can be maintained.

The invention can be further understood with reference to FIGS. 1–12.

FIG. 1 illustrates, in a flow chart, a process used to form an improved oxynitride gate dielectric region in accordance with the present invention. The process of FIG. 1 begins at a step 10. In step 10, a semiconductor wafer is provided wherein the semiconductor wafer is beginning the initial stages of semiconductor processing. The wafer may or may not have already been processed to contain field oxide isolation, trench isolation, and or the like as is known in the art. This semiconductor substrate is exposed to a hydrogen-containing ambient, such as a hydrofluoric (HF) environment, to perform an ex situ aqueous pre-clean of the semiconductor substrate surface. This hydrofluoric (HF) processing is performed to remove oxygen atoms and/or other native contaminants from a top surface of the semiconductor substrate. As an alternative to an HF aqueous pre-clean, an HF vapor clean can be performed on the semiconductor substrate to perform a similar function. Ion milling or reactive ion etching (RIE) of the semiconductor substrate may also be utilized to some degree. In addition, although ex situ HF processing is disclosed, batch tools and cluster tools do exist wherein an HF vapor clean may be performed in situ with the rest of the processing subsequently discussed herein. Generally, step 10 is performed to create a hydrogen-passivated or terminated semiconductor substrate surface which is clean from native oxide and like contaminants.

After step 10, the pre-cleaned semiconductor substrate is placed into a cluster CVD tool (common processing environment) comprising at least two different CVD chambers. In step 20, the semiconductor wafer is placed into a first of these at least two clustered CVD chambers. This first chamber is referred to as an epitaxial silicon chamber or as a polysilicon deposition chamber. While in this first chamber, the semiconductor wafer, which was cleaned in step 10, is exposed to an inert ambient while temperature ramping is performed. Step 20 preferably involves exposing the semiconductor wafer to one or more of a nitrogen ($N_2$) ambient, a hydrogen ($H_2$) ambient, or a combination thereof. During the processing illustrated in step 20, a temperature of the wafer is ramped from roughly room temperature to an elevated processing temperature of preferably 1080° C. It is important to note that this final processing temperature may be any temperature substantially within a range within 800° C. to 1200° C.

In step 20, it is most advantageous to ensure that the ambient inert gas flows are such that no nitridation of the semiconductor substrate surface occurs. It is important to note that there is a critical temperature below which $N_2$ may be flowed without creating a nitrided surface on the semiconductor wafer. Above this critical temperature, the nitrogen ($N_2$) should preferably be removed from the chamber and replaced with a hydrogen ($H_2$) ambient to prevent nitridation of the surface above the critical temperature. Therefore, in a preferred step 20, a nitrogen gas is provided to the chamber at temperatures below the critical temperatures while this nitrogen flow is replaced either rapidly or gradually with a hydrogen gas flow once temperatures reach and/or exceed the critical temperature. By performing this combined $N_2/H_2$ ramp, the pre-cleaned semiconductor substrate surface which was hydrogen passivated in step 10 is further preserved through the temperature elevation processing of step 20.

When the wafer is placed into the first chamber of the cluster tool, oxygen may be trapped or present in the system. This oxygen may contaminate the wafer during the temperature ramp of step 20. Therefore, in a step 30, any residual oxide or newly-formed oxide on the semiconductor substrate surface is removed by annealing in a reducing ambient, such as hydrogen. Accordingly, the inherent oxidation due to introduction of wafers into processing tools can be reversed or reduced in impact via the hydrogen anneal process of step 30. In a preferred form, the hydrogen anneal of step 30 is performed at roughly 1080° C. for roughly 20 seconds. However, it should be noted that other temperatures and time periods may be used and that other gas flows and compositions can be utilized to perform the oxide removal function discussed with respect to step 30.

Next, at step 40, the wafer is transferred to the second chamber of the at least two clustered CVD chambers. This second clustered chamber is referred to as a nitride LPCVD chamber.

In a step 50, an optional nitridation of the surface of the semiconductor substrate is performed. Note that both steps 50 and 60 are optional and that processing may directly continue with step 70 from step 40. Furthermore, only one of steps 50 or 60, and not both, may be performed in the process flow taught herein. Since step 50 is optional, step 50 need not be performed in all circumstances to render a gate dielectric which is fully functional and advantageous as taught herein. The step 50 is typically performed to provide a nitrided passivated top surface of the semiconductor substrate after steps 20–40 are performed in order to ensure that any subsequent oxidation of the silicon semiconductor substrate is reduced. Typically, the processing of step 50 is performed by exposing the semiconductor substrate to an ammonia ($NH_3$) ambient at roughly 750° C. for roughly 10 seconds. It is important to note that the nitridation processing of step 50 can occur at different temperatures and for different time periods as is needed for specific embodiments. In addition, the $NH_3$ of step 50 can be replaced with other nitrogen containing gases such as NO, $N_2$, $N_2H_4$, or a combination thereof. Note that although NO comprises both nitrogen and oxygen, the silicon of the semiconductor substrate prefers to atomically bond to the nitrogen whereby a nitrided surface, and not an oxidized surface, is formed by using an NO source gas in step 50.

After performing the optional step 50, an optional step 60 may be performed. In step 60, a top exposed surface of the semiconductor wafer is oxidized using a gas source flow that comprises oxygen. In a preferred form, step 60 is performed at 900° C. for 10 seconds whereby the wafer is exposed for this time period to a gas flow comprised of $N_2O$. It is important to note that the temperature and the time of oxidation can be altered while still achieving similar results. In addition, the $N_2O$ (i.e., oxygen-containing gas) used in step 60 can be replaced with oxygen ($O_2$), ozone ($O_3$) or carbon dioxide ($CO_2$). The optional process of step 60 is used to improve the reliability of the interface of the gate dielectric to the semiconductor substrate. For example, step 60 can be utilized to remove many of the nitrogen related trap sites present in the nitrided material formed in step 50.

After the optional steps 50 and 60, a preferred step 70 is performed. In step 70, an LPCVD or RTCVD silicon nitride deposition process is performed. The silicon nitride deposition is preferably performed at 750° C. using a dichlorosilane (DCS) and ammonia ($NH_3$) ambient. While the wafer is being exposed to the DCS/$NH_3$ gas ambient, some quantity of $N_2O$ is preferably flowed into the chamber either overlapping with the $NH_3$ flow or mutually exclusive from the $NH_3$ flow (e.g., before or after the $NH_3$ flow). It is important to note that the $NH_3$ gas discussed with respect to step 70 can be replaced with any nitrogen-containing gas, and that the $N_2O$ discussed with respect to step 70 can be replaced with any oxygen-containing gas. Over the time it takes to deposit the bulk of the dielectric material in step 70, one or both of the flow rates of the oxygen containing gas ($N_2O$) and the nitrogen containing gas ($NH_3$) is altered in a controlled fashion. This altering of the ratio between the nitrogen-containing gas being flowed in the chamber and the oxygen-containing gas being flowed into the chamber will allow for custom-tailoring of one or more of an oxygen profile and/or a nitride profile throughout the bulk material of the oxynitride gate dielectric film. For further discussion and illustration of this atomic O and atomic N profile phenomenon, refer to FIGS. 2–8. The resulting level of oxygen within the final gate dielectric film should be high enough to suppress the adverse charge trapping in the nitride gate dielectric film, but low enough to maintain a high dielectric constant ($e_r$) whereby MOS transistor performance is improved and gate-to-channel leakage current is reduced. The resulting relative dielectric constant ($e_r$) of the gate dielectric taught herein will typically be between 5.0 and 8.0 depending upon the flow rate of the oxygen-containing gas and the profile of oxygen in the final film.

In a step 80, a superficial oxidation of a top portion of the oxynitride formed in step 70 is performed. Preferably, this superficial oxidation is performed utilizing an $N_2O$ ambient within the same processing chamber utilized to form the bulk oxynitride gate dielectric material in step 70, however, other oxygen containing molecules may be used.

After step 80, the wafer is once again transferred to the first chamber in the CVD cluster tool. In an alternative form, step 90 may require that the wafer be transferred to yet a third processing chamber in the CVD cluster tool. In step 90, the wafer is being positioned to perform a capping operation of the dielectric material formed via steps 10–80 whereby this capping operation will ensure that the custom profiling of the oxygen and nitrogen concentration through the depth of the gate dielectric material remains substantially unchanged throughout subsequent processing.

In step 100, an in situ high-temperature anneal in an inert gas ambient is performed. Preferably, the inert gas utilized in step 100 is one of either argon (Ar) or nitrogen ($N_2$). Preferably, this high temperature in situ anneal is performed at 1080° C. for roughly 20 seconds. This anneal process is performed to remove hydrogen atoms from the final gate dielectric structure. These hydrogen atoms may have been incorporated into the gate dielectric structure through wafer exposure to ammonia, HF, $H_2$ or like hydrogen-containing gases in previous processing steps, such as steps 10–90.

After the optional step 100 is performed, an in situ capping of the gate dielectric is performed via a step 110. In step 110, polysilicon and/or amorphous silicon (a-Si) is deposited to a thickness of roughly 50 angstroms to 1,000 angstroms over the dielectric layer previously formed via steps 10 through 100. This polysilicon capping layer will ensure that any subsequent exposure of the wafer to an oxygen-containing ambient will not adversely affect the tailored and intended oxygen/nitrogen profile of the oxynitride gate dielectric formed via the steps 10–90.

In a step 120, yet another optional high temperature anneal may be performed in addition to or in lieu of the step 100. This high temperature anneal is similar to the high temperature anneal discussed with respect to step 100 and is utilized to remove hydrogen from the final gate dielectric structure. In step 120, the wafer is also thermally ramped downward in temperature to close to room temperature in order to facilitate removal of the wafer from the cluster CVD processing tool.

FIGS. 2–8 serve two specific purposes. First, a left hand portion of FIGS. 2–8 illustrate the cross-sectional device which results from the processing previously discussed with respect to FIG. 1. A right hand portion of FIGS. 2–8 illustrate the silicon, oxygen, and nitrogen concentrations/profiles of the various material as they are formed through the processing taught via FIG. 1.

Figure 2:
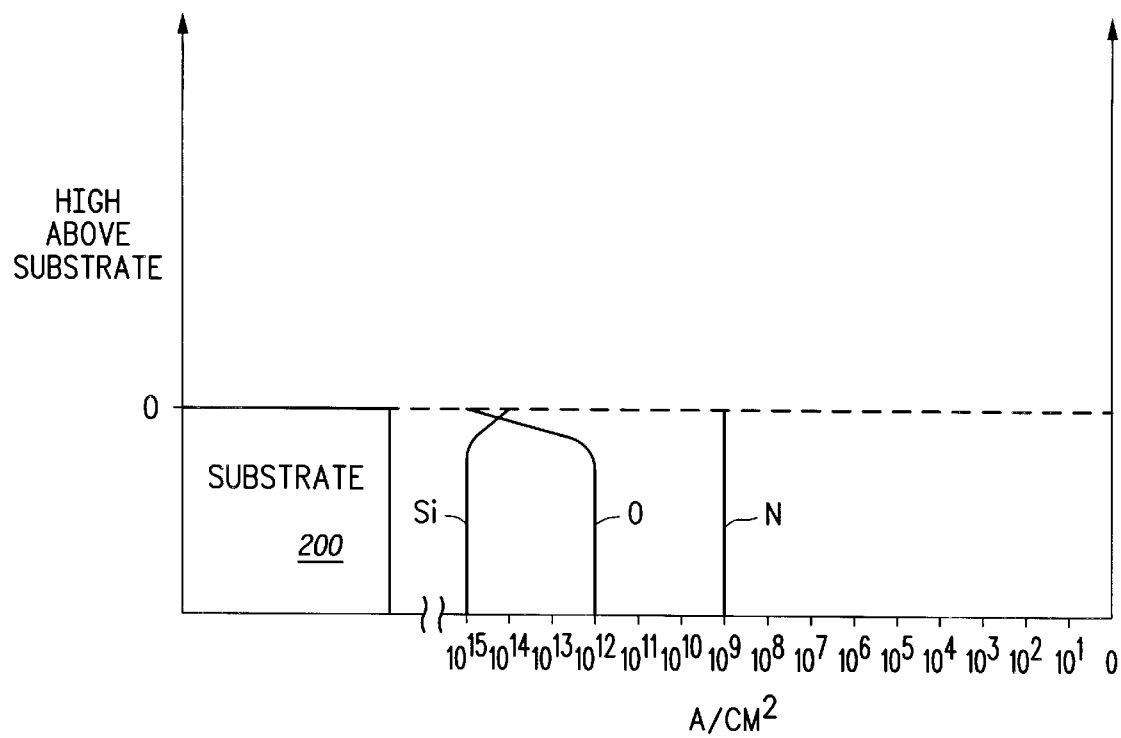
FIGS. 2–8 illustrate, in cross-sectional diagrams and corresponding XY plots, an improved gate dielectric formation and the atomic composition of this gate dielectric material in accordance with the present invention.

FIG. 2 illustrates the that a silicon semiconductor substrate 200 is provided. In a preferred form, the semiconductor substrate 200 is a silicon wafer on which many integrated circuits (ICs) will be formed. However, the semiconductor substrate 200 taught herein can be any semiconductor substrate as is known in the art. In a right hand portion of FIG. 2, it is illustrates that the semiconductor substrate material is largely made of silicon ($10^{15}$ atoms/cm$^2$). The bulk region of the semiconductor substrate contains some lower levels of oxygen and nitrogen atomic concentrations ($10^{12}$ and $10^9$ atoms/cm$^2$ respectively). An upper portion of the semiconductor substrate material 200 contains a native oxide region wherein the oxygen concentration increases at the expense of the silicon concentration. In this upper native oxide portion of the semiconductor substrate 200, a percentage concentration of silicon atoms is slightly reduced whereas a concentration of oxygen atoms increases by orders of magnitude. A thickness of an oxygen-rich upper native oxide region of the semiconductor substrate 200 as illustrated in FIG. 2 is typically on the order of 10 angstroms or less in depth. As is illustrated in FIG. 2, a nitrogen concentration throughout a bulk of a semiconductor substrate is roughly constant from the bulk to the surface of the semiconductor substrate.

Figure 3:
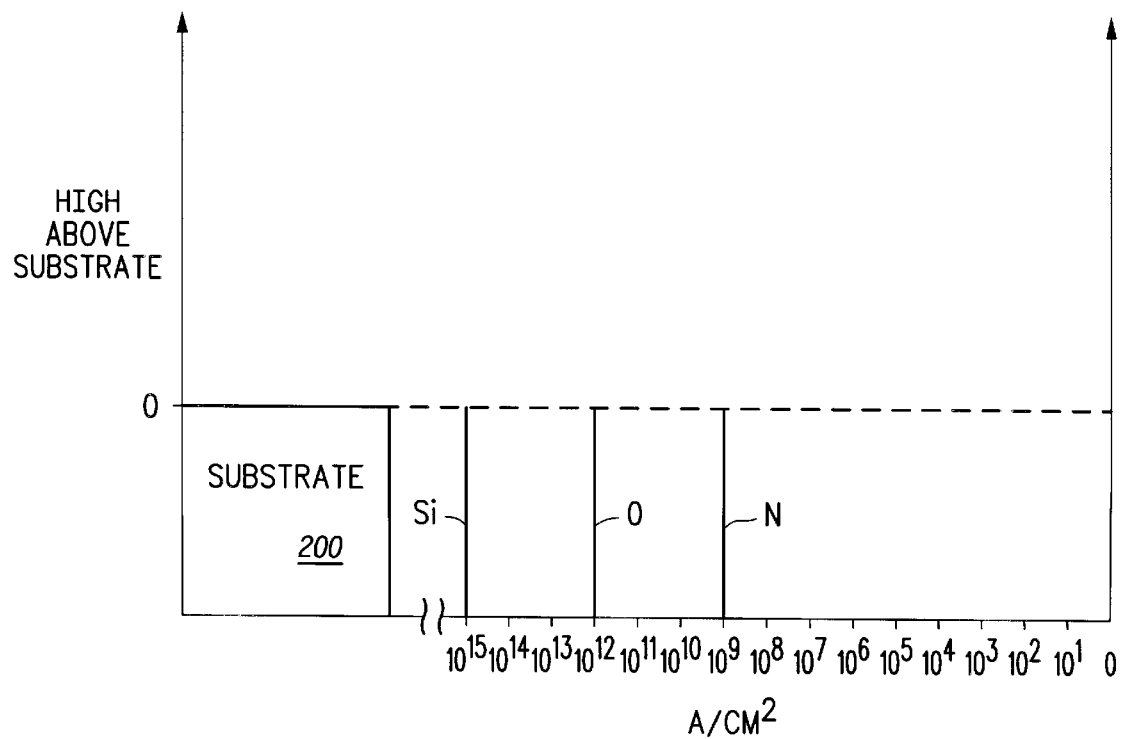

FIG. 3 illustrates the composition changes which occur within the semiconductor substrate 200 after the processing from steps 10–30 of FIG. 1 is performed. As previously discussed for steps 10–30 of FIG. 1, HF processing and oxide removal processing is utilized in steps 10–30 in order to clean/remove oxide material from a top surface of the semiconductor substrate 200. As is illustrated in FIG. 3, this H$_2$ annealing and HF processing results in removal of the native oxide and oxygen atoms from the surface of the semiconductor substrate 200 whereby a pure silicon surface is once again restored at the surface of the semiconductor substrate 200. Note that the surface concentration of Si and O at the semiconductor substrate surface is now substantially similar to the bulk semiconductor substrate composition.

Figure 4:
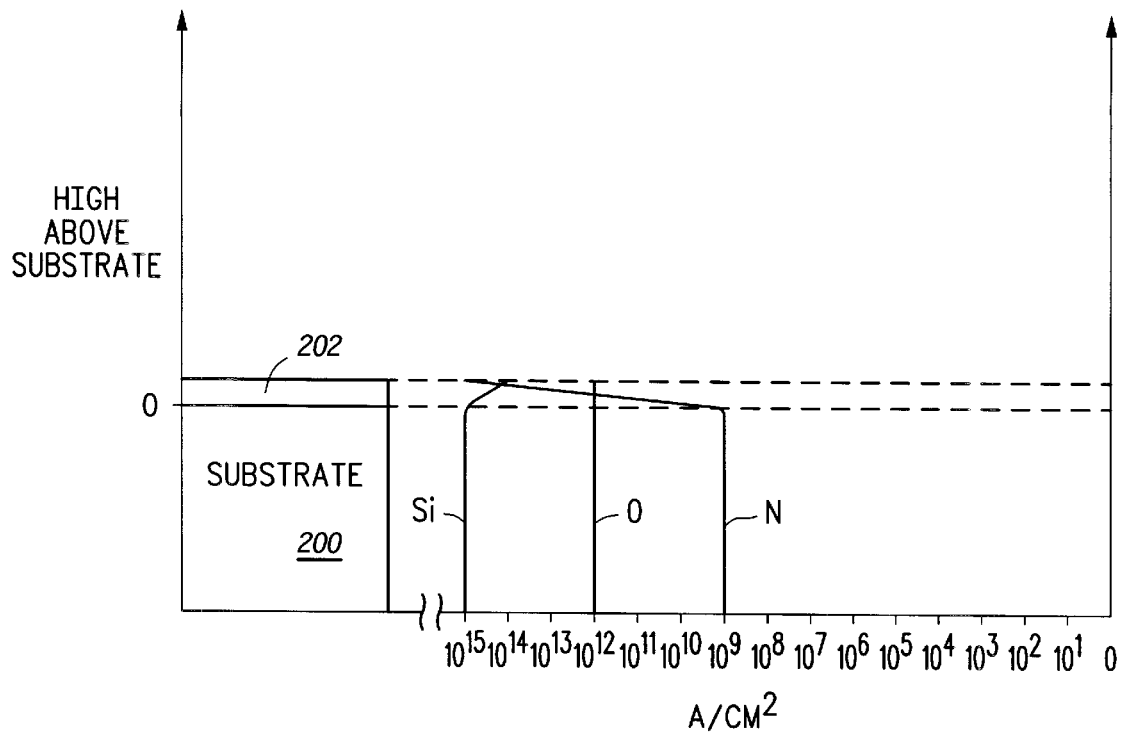

FIG. 4 illustrates the optional processing discussed in step 50 of FIG. 1. In step 50, an optional nitridation of the silicon surface is performed using ammonia (NH$_3$) or a like nitrogen containing gas. As illustrated in FIG. 4, this nitridation step 50 results in the formation of a thin nitrided layer 202 on a top surface of the semiconductor substrate 200 as illustrated in the left hand region. As also illustrated in FIG. 4, the silicon concentration within this layer 202 is slightly less than that of the bulk semiconductor substrate 200, whereas the nitrogen atom concentration of the layer 202 is greatly increased over that of the semiconductor substrate 200. In other words, layer 202 is layer comprising high concentrations of both N and Si whereas the bulk semiconductor substrate 200 has a high concentration of only Si. The layer 202 in FIG. 4 is substantially a nitride Si$_x$N$_y$. The oxygen concentration across layers 200 and 202 is not substantially different in FIG. 4 after the processing of step 50.

Figure 5:
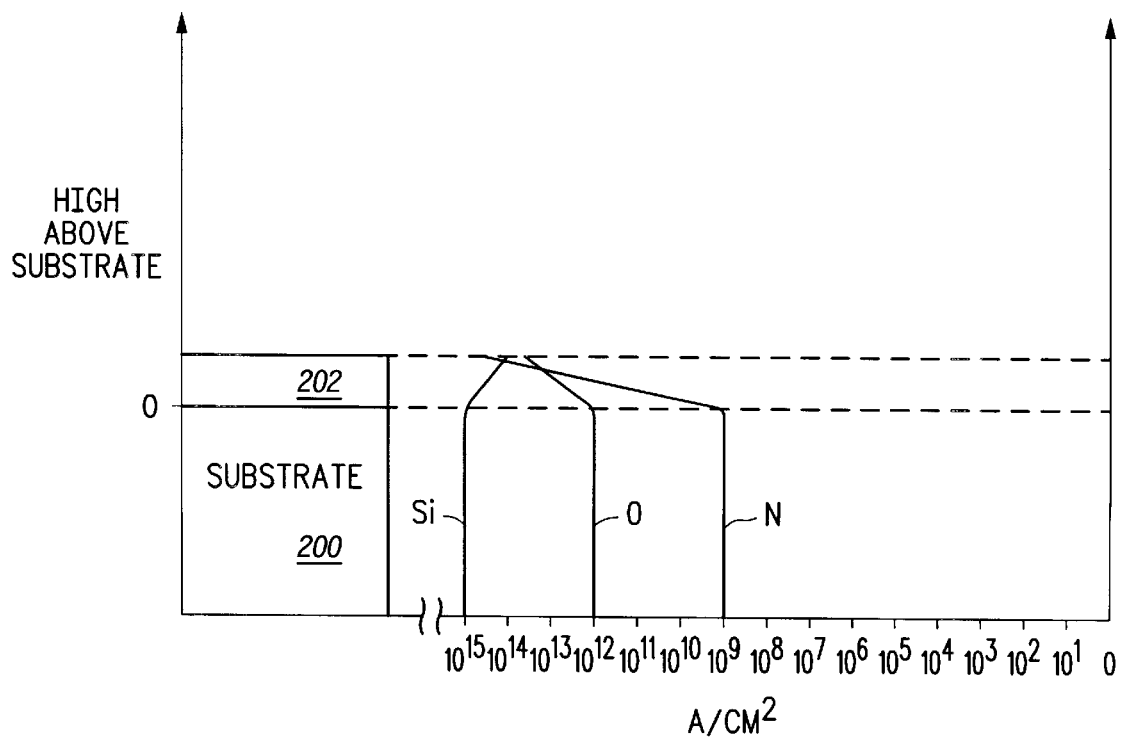

FIG. 5 illustrates the optional processing discussed in step 60 of FIG. 1. In step 60, the nitrided surface formed via step 50 (see layer 202 of FIG. 4) is exposed to an oxygen-containing gas whereby a predetermined depth into the surface of layer 202 is slightly oxidized. In step 60, as illustrated in FIG. 5, the oxygen concentration of the film 202 is slightly increased due to the oxygen exposure discussed with respect to step 60 of FIG. 1. This increase in oxygen concentration near a top surface of layer 202 of FIG. 5 (due to the processing of step 60 in FIG. 1) will result in a slight decrease in nitrogen concentration as oxygen concentration increases towards the top of the film 202. However, the oxidation processing of step 60, which is illustrated in FIG. 5, is such that the nitrogen concentration of a top portion of the film 202 is still greater than an oxygen concentration at the top of film 202.

Figure 6:
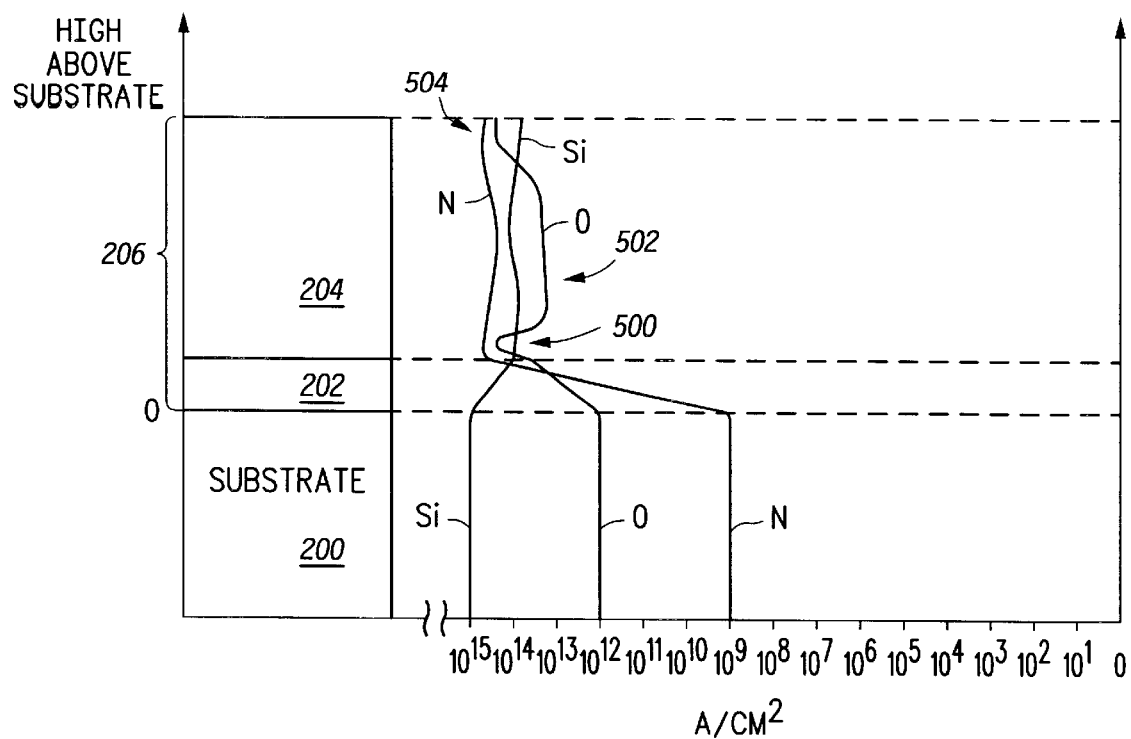

FIG. 6 illustrates the resulting structure and Si/O/N concentrations which result from the processing previously discussed with respect to step 70 of FIG. 1. In step 70 of FIG. 1, the bulk 204 of the total gate dielectric 206 is formed. This bulk layer 204 is formed by the LPCVD of a silicon oxynitride material using a dichlorosilane (DCS) source, a nitrogen-containing source, and an oxygen-containing source. Preferably, dichlorosilane (DCS), NH$_3$, and N$_2$O are utilized for step 70 of FIG. 1. FIG. 6 illustrates the effects of the N$_2$O being flowed into the chamber at a high rate during the initial deposition of the bulk material 204. Due to a high initial N$_2$O flow rate, a lower portion of the layer 204 has a high oxygen concentration at the expense of one or more of Si/N atoms. Therefore, FIG. 6 illustrates an oxygen concentration bump 500 resulting from this high initial flow rate of N$_2$O during the initial incremental deposition of material in step 70. Oxygen concentration bump 500 is a spike (e.g., less than 10 Angstrom thick) of oxygen atomic concentration near an interface between the layer 202 (formed in step 60 of FIG. 1) and layer 204 (formed in step 70 of FIG. 1).

After this brief time period, wherein N$_2$O flow is relatively high, the N$_2$O flow is reduced in rate for a middle time period of the deposition process of step 70. This reduction in the N$_2$O flow during a middle time period of deposition in step 70 results in a middle portion 502 of the layer 204 being reduced in oxygen concentration as illustrated in FIG. 6. Near an end of the deposition process of step 70, the N$_2$O flow rate is once again increased to result in an increased oxygen concentration near a top deposited portion 504 of the layer 204. It is important note that FIG. 6 illustrates the results of the ammonia flow as well as the dichlorosilane flow of FIG. 6 being roughly kept constant whereby roughly constant silicon and nitrogen profiles/compositions occur throughout the film 204. However, it is important to note that FIG. 6 and step 70 of FIG. 1 clearly teach that any profile of any one of oxygen (O), silicon (Si), and/or nitrogen (N) can be incrementally and custom-made in the bulk material 204 through absolute and/or relative gas flow control. Therefore, any one or more of the nitrogen-containing gas (NH$_3$), the silicon-containing gas (DCS), and/or the oxygen-containing gas (N$_2$O) can be computer controlled very accurately throughout the total deposition processing time of step 70 to result in any oxygen, silicon, and/or nitrogen profile which is desired for any application. These Si/N/O profiles through the oxynitride gate dielectric 206 can be altered to obtain any desired permittivity between roughly 4.0 and 8.0 or any desired oxygen distribution which is needed to enhance and preserve MOS transistor performance.

Figure 7:
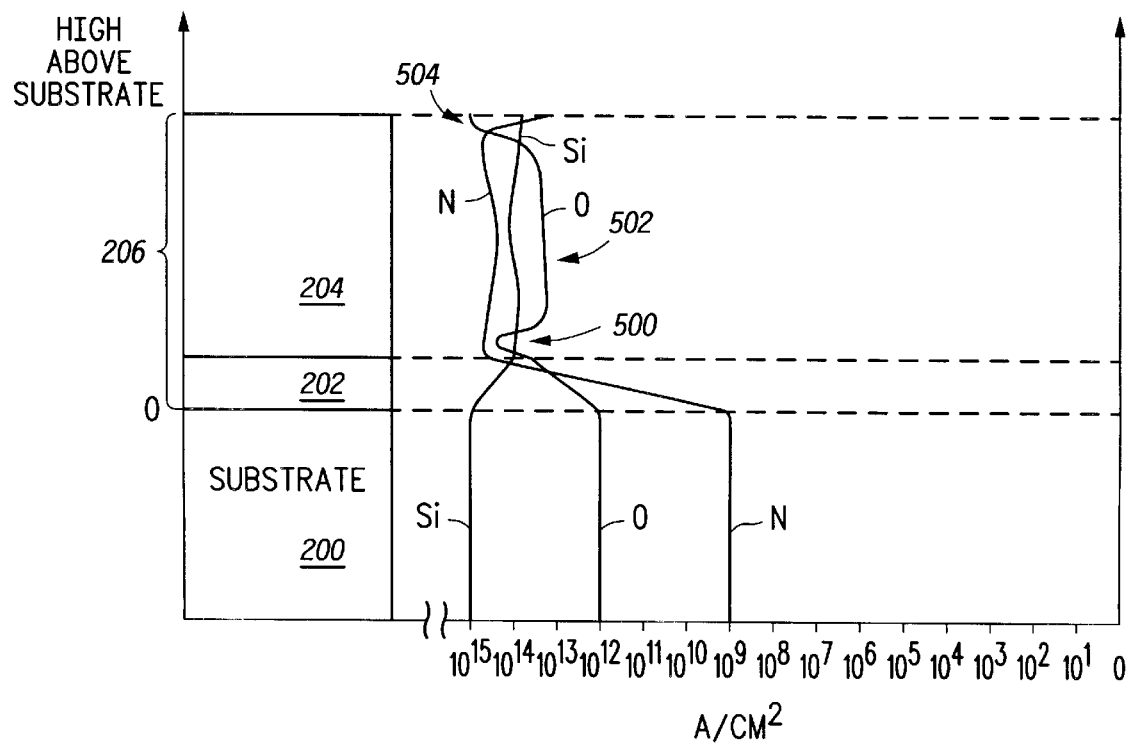

FIG. 7 illustrates the optional oxidation process discussed with respect to step 80 of FIG. 1. In step 80, an N$_2$O gas flow is present across the wafer surface. This N$_2$O optional flow will increase the concentration of oxygen (O) across the layer 204 of FIG. 7 while reducing the nitrogen concentration of a top surface of this same layer 204. This concentration change is clearly illustrated in FIG. 7 and is optional in the overall process.

Figure 8:
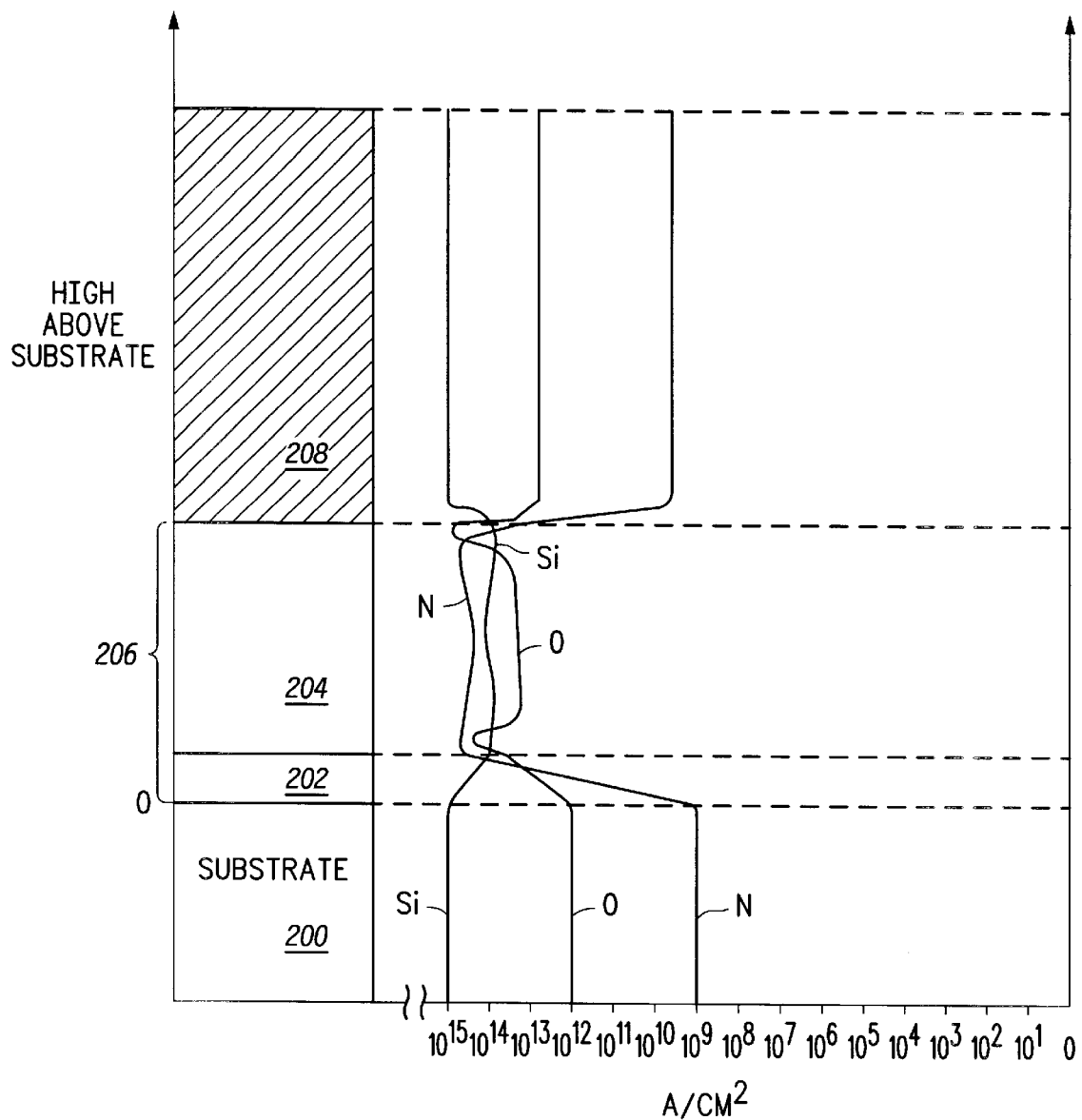

After completion of the step 80 (see FIG. 7), steps 90–120 of FIG. 1 are performed wherein the resulting device from performing steps 90–120 are illustrated in FIG. 8. In steps 90–120, an in situ polysilicon or amorphous silicon (a-Si) capping layer 208 is deposited directly on top of the bulk dielectric material 204. As illustrated in FIG. 8, the silicon concentration of the layer 208 is high, whereas the oxygen and nitrogen concentrations of the polysilicon and/or amorphous silicon layer 208 are similar to that for the semiconductor substrate material 200. Typically, the oxygen and nitride composition of polysilicon material 208 is greater than the oxygen and nitrogen composition of the semiconductor substrate 200 by approximately two orders of magnitude. As illustrated in FIG. 8 and discussed with respect to step 110 of FIG. 1, the capping polysilicon layer 208 will protect underlying materials 202 and 204 from the adverse oxidizing effects of subsequent room ambients or oxygen containing ambients (e.g., such as $O_2$ plasma ashing). Any oxygen atoms present at a top surface of layer 208 will not be able to readily diffuse through the layer 208 to alter the oxygen profiles of layers 202 and 204. Therefore, the Si/O/N formed profiles illustrated in FIG. 8 with respect to layers 202 and 204 are subsequently preserved through any subsequent semiconductor processing up through final IC device packaging and shipment. Due to the protective capping, the dielectric constant, effective oxide thickness (EOT), and the performance capability of MOS transistors utilizing the layers 202 and 204 are adequately preserved over time unlike the prior art.

Figure 9:
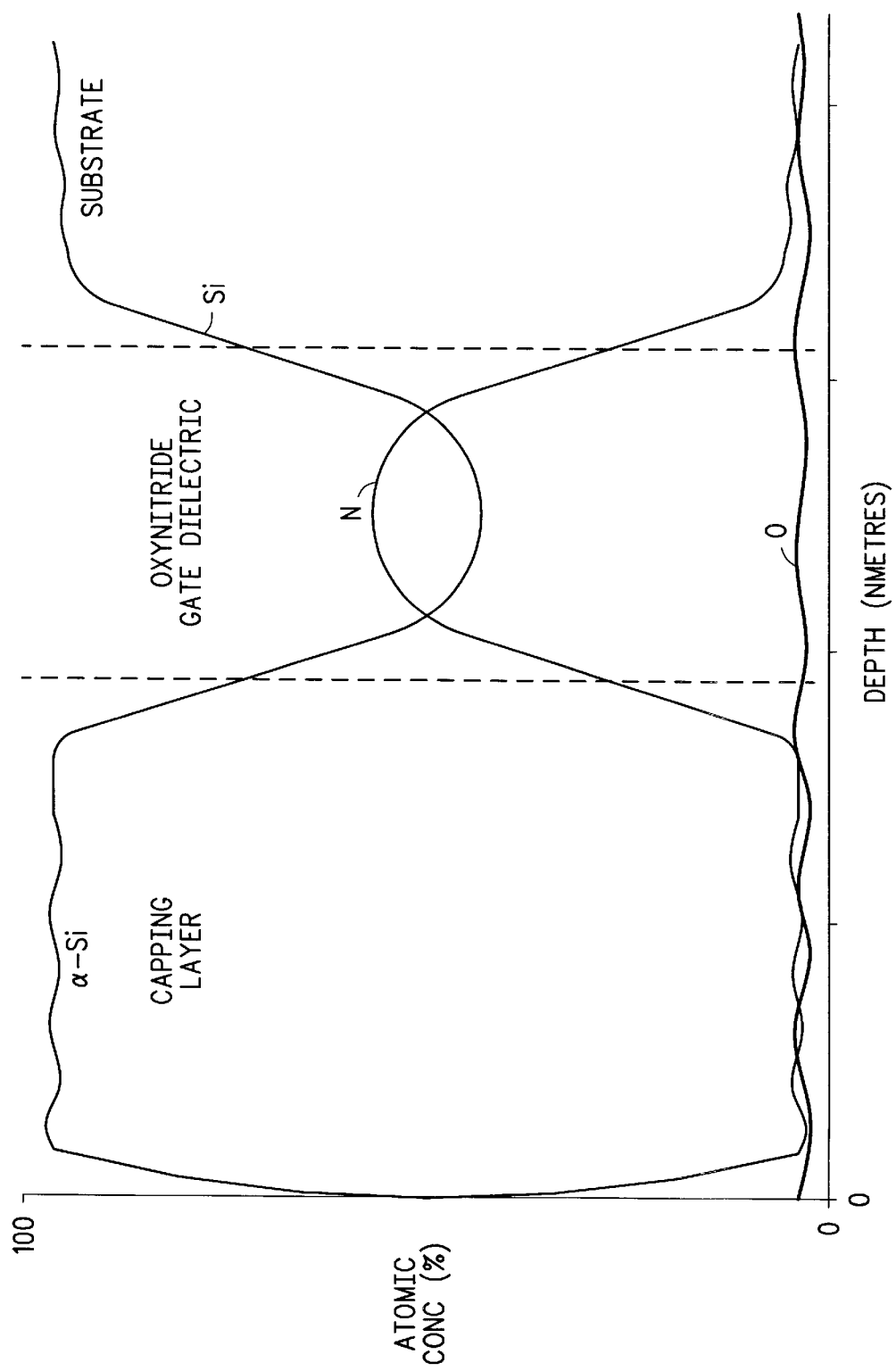
FIG. 9 illustrates, in an XY plot, Auger data which indicates that an in situ polysilicon-capped silicon nitride layer can be effectively protected from subsequent oxidizing environments in accordance with the present invention.

FIG. 9 illustrates the measured results taken from a modified process of FIG. 1 in order to illustrate a specific point. The specific point of FIG. 9 is that the in situ deposition of a capping polysilicon layer 208 or capping amorphous silicon layer 208 adequately serves the desired purpose of protecting the tailored oxygen concentration and oxygen profile of the underlying oxynitride gate dielectric 206 of FIG. 8. FIG. 9 illustrates, in a right hand portion of FIG. 9, the presence of a silicon semiconductor substrate. A middle portion of FIG. 9 clearly illustrates the high nitrogen concentration of a silicon nitride layer as formed via the processing taught herein. The silicon nitride layer in a middle portion of FIG. 9 is formed in the second chamber of a cluster CVD tool.

It is important to note that the silicon nitride formed in FIG. 9 is a relatively pure silicon nitride layer ($Si_xN_y$) having almost no oxygen content whatsoever. Therefore, FIG. 9 illustrates that the oxygen concentration of the silicon nitride layer in a middle portion of FIG. 9 is very low. After formation of this silicon nitride layer with a low oxygen concentration, a capping polysilicon or amorphous silicon layer is formed in a left-hand portion of FIG. 9 in a first CVD cluster chamber. As can be seen from the oxygen concentration data in FIG. 9, the formation of the polysilicon capping layer in a left hand portion of FIG. 9 ensures that the low oxygen concentration of the pure silicon nitride gate dielectric in a middle portion of FIG. 9 is undisturbed over time. Therefore, in summary, FIG. 9 illustrates that even a very low oxygen profile which is custom-tailored within any underlying oxynitride gate dielectric will be preserved in a substantially unaltered state by a subsequently deposited in situ polysilicon capping layer as taught herein. Therefore, any customized nitrogen and oxygen profile created in step 70 in FIG. 1 and illustrated in FIG. 8 herein will be preserved by the capping layer 208 of FIG. 8 as clearly indicated via the results of FIG. 9.

Figure 10:
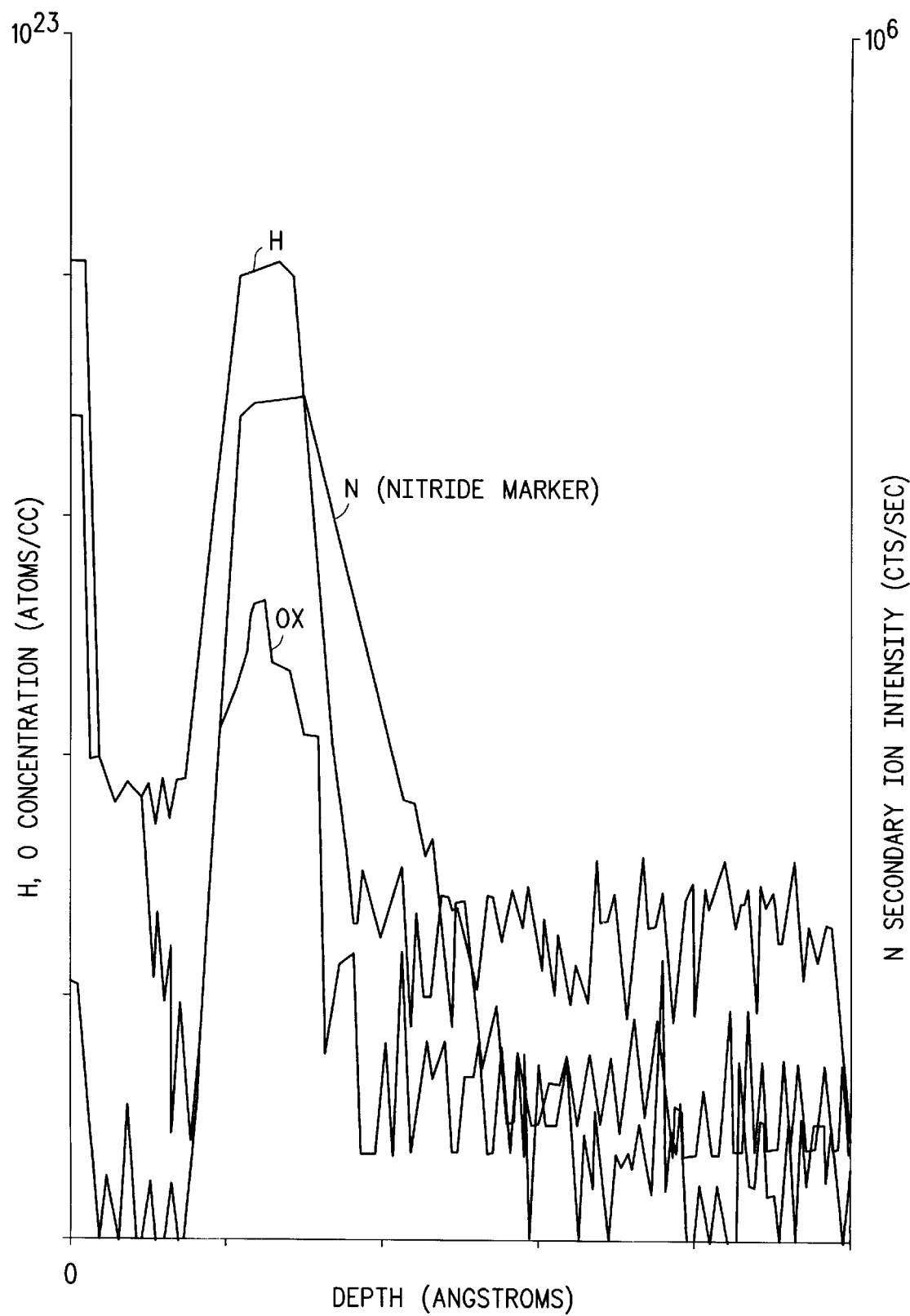
FIG. 10 illustrates, in an XY plot, SIMS data similar to the Auger data illustrated in FIG. 9 in accordance with the present invention.

While FIG. 9 illustrates Auger analysis, FIG. 10 illustrates the same device utilizing SIMS analysis. SIMS analysis is more sensitive to low concentration atomic elements. Therefore, FIG. 10 is a more detailed analysis of the oxygen concentration within the oxynitride gate dielectric of FIG. 9. The SIMS analysis of FIG. 10 confirms the Auger analysis of FIG. 9 in that the oxygen concentration and profile of an oxynitride gate dielectric formed using the processing herein is well protected. In fact, a polysilicon capping layer as taught allows oxygen concentrations as low as 0.5% to be maintained in a gate dielectric for long periods of time.

Figure 11:
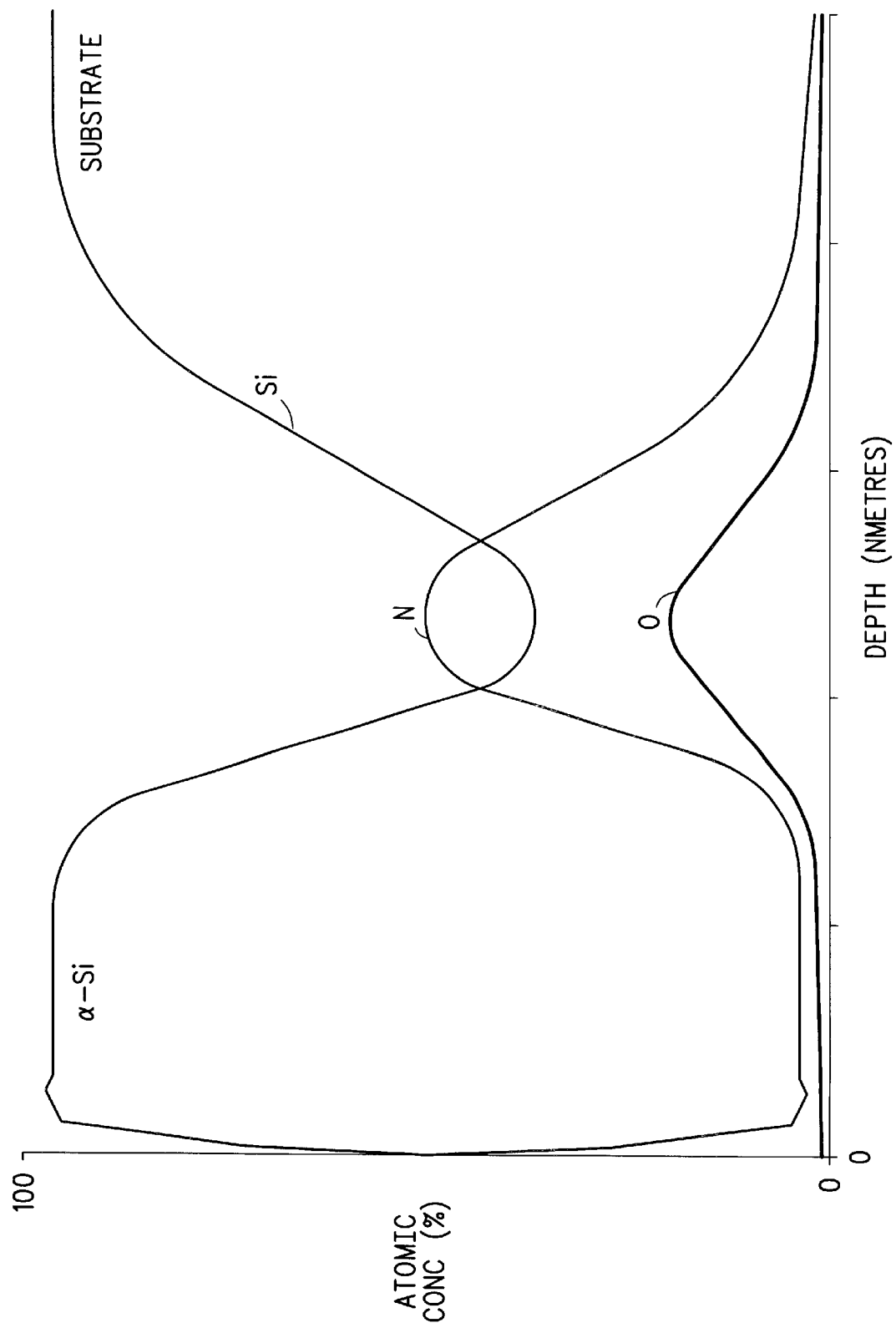
FIGS. 11 and 12 illustrate, in XY plots, data which shows that both the oxygen concentration and the oxygen profile through a bulk portion of an oxynitride gate dielectric can be custom-tailored and adequately protected over time whereby MOSFET performance is improved in accordance with the present invention.
Figure 12:
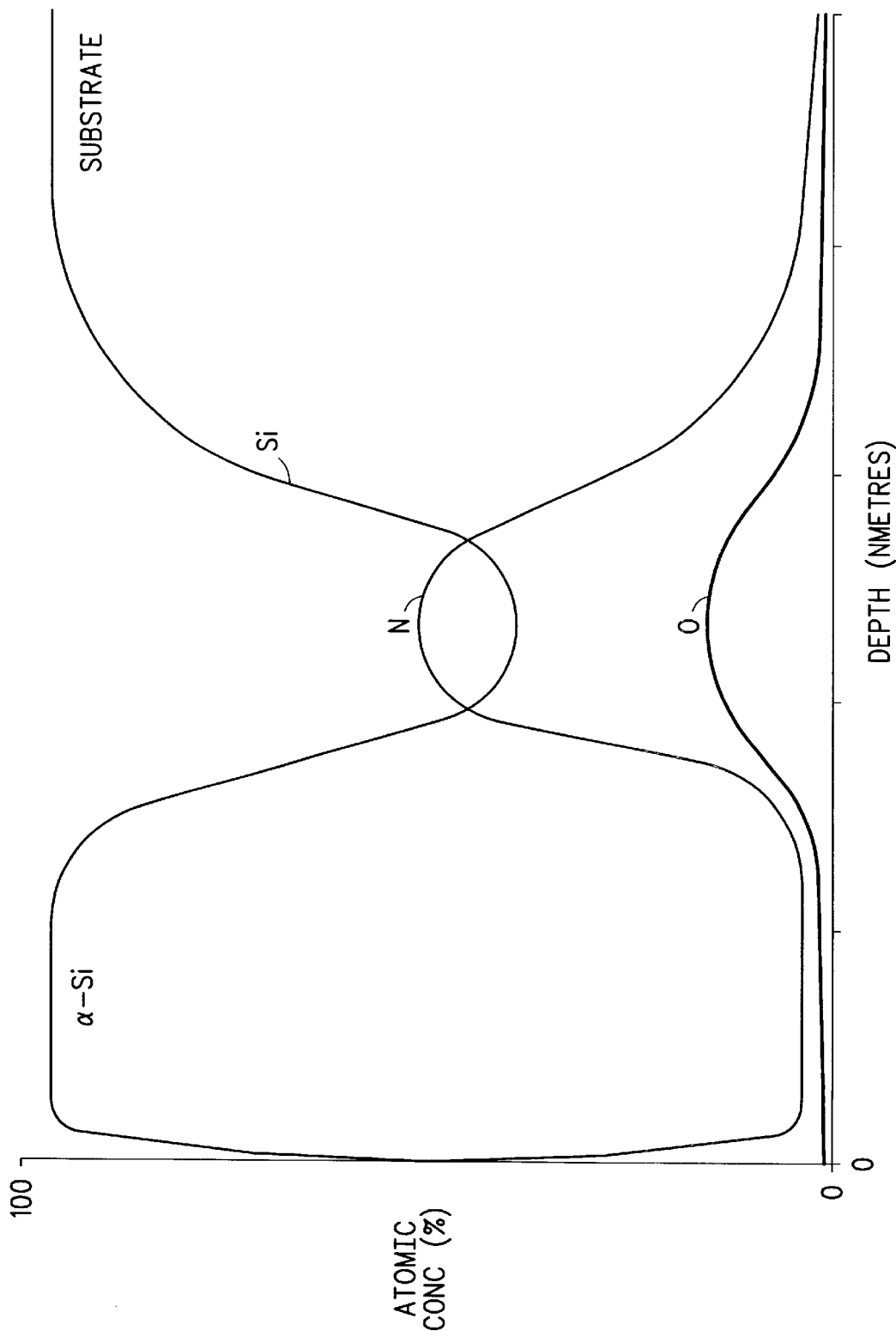

FIGS. 11 and 12 illustrate that the processing taught herein with respect to step 70 can be customized to form different oxygen concentrations and oxygen profiles within an oxynitride gate dielectric layer as is needed. These customized oxygen profiles and concentrations are protected and preserved by a capping polysilicon layer or amorphous silicon layer. FIG. 11 illustrates that a peak concentration of oxygen within an oxynitride gate dielectric layer of roughly 20 atomic percent can be achieved using the process of FIG. 1. However, FIG. 12 illustrates that a changing of gas flows, specifically changing the $N_2O$ gas flow or changing to another like oxygen-containing gas flow in step 70, can result in different oxygen concentrations within an oxynitride gate dielectric region. Specifically, FIG. 12 illustrates a peak O concentration of roughly 15 atomic percent.

OTHER EMBODIMENTS

The present invention relates generally to semiconductor manufacturing, and more particularly to, making a nitrogen rich silicon nitride film using a rapid thermal chemical vapor deposition process. Alternate embodiments of the present invention form a gate dielectric having a nitrogen rich silicon nitride layer formed using a rapid thermal chemical vapor deposition system. One embodiment of the present invention is illustrated in FIGS. 13–20 and described herein below.

Figure 13:
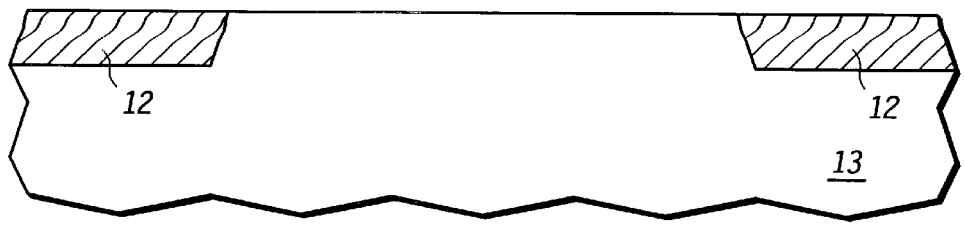
FIG. 13 includes an illustration of a cross-sectional view of a portion of a semiconductor device substrate after forming field isolation regions.

FIG. 13 includes a cross-sectional view of a portion of a semiconductor device substrate 13. As used in this specification, a semiconductor device substrate 13 includes a monocrystalline wafer, a semiconductor-on-insulator wafer or any other substrate used to form semiconductor devices. In this particular instance, substrate 13 is lightly doped p-type silicon. Within the semiconductor substrate are formed field isolation region 12. In this particular embodiment, the field isolation regions 12 are formed using a shallow trench field isolation process.

Figure 14:
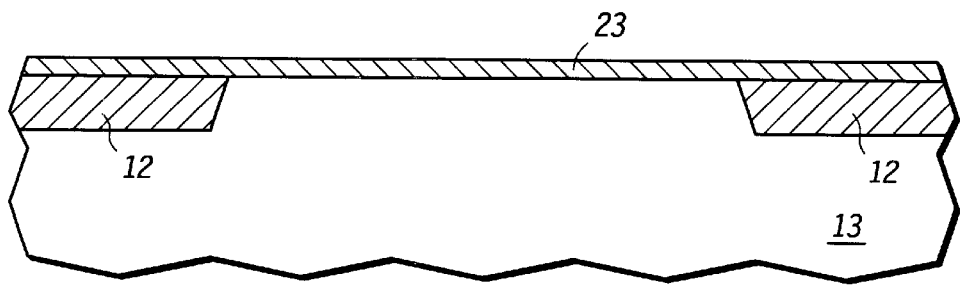
FIG. 14 includes an illustration of a cross-sectional view of the substrate of FIG. 13 after forming a gate dielectric layer in accordance with an embodiment of the present invention.

A gate dielectric layer 23 is formed over the substrate 13 as illustrated in FIG. 14. The gate dielectric layer 23 in this embodiment includes a nitrogen rich silicon nitride layer that is formed using a rapid thermal chemical vapor deposition system. More specifically, the gases used to form this include ammonia ($NH_3$) and dichlorosilane ($SiCl_2H_2$). Generally, the temperature for this deposition is about the same as conventional silicon nitrides formed using conventional LPCVD processes that take over two hours to perform. More specifically, the temperature is generally in range of approximately 650° C.–800° C. Unlike the conventional LPCVD batch process, the pressure is typically higher than it is for a conventional LPCVD system. In this particular embodiment, the pressure is more than 20 torr and generally is in a range of approximately 1–100 torr.

The ratio of the ammonia to the dichlorosilane is typically at least 10:1 and may be increased if leakage current for the device is an issue. As alternatives to these chemicals, other nitrogen-containing and silicon-containing gases could be used. For example, hydrazine ($N_2H_2$) or amides, such as ethylene diamine, ammonium azide, azoimide cyclohexyl amine, etc., can be used as the nitrogen source gas. The dichlorosilane may be replaced with other chlorine-containing silane compounds (e.g. $SiCl_xH_y$, where x+y=4) or chlorine-containing disilane compounds (e.g. $Si_2Cl_aH_b$, where a+b=6), such as the species used for the silicon source should be such that the deposition temperature is within a range 650–800° C. Further, unlike the conventional PECVD, this deposition is performed without the use of a plasma. The gate dielectric film 23 has a dielectric constant in a range of approximately 6.3–6.7, compared to silicon dioxide, which is approximately 3.9, and conventional silicon nitride, which is approximately 7.8.

Figure 15:
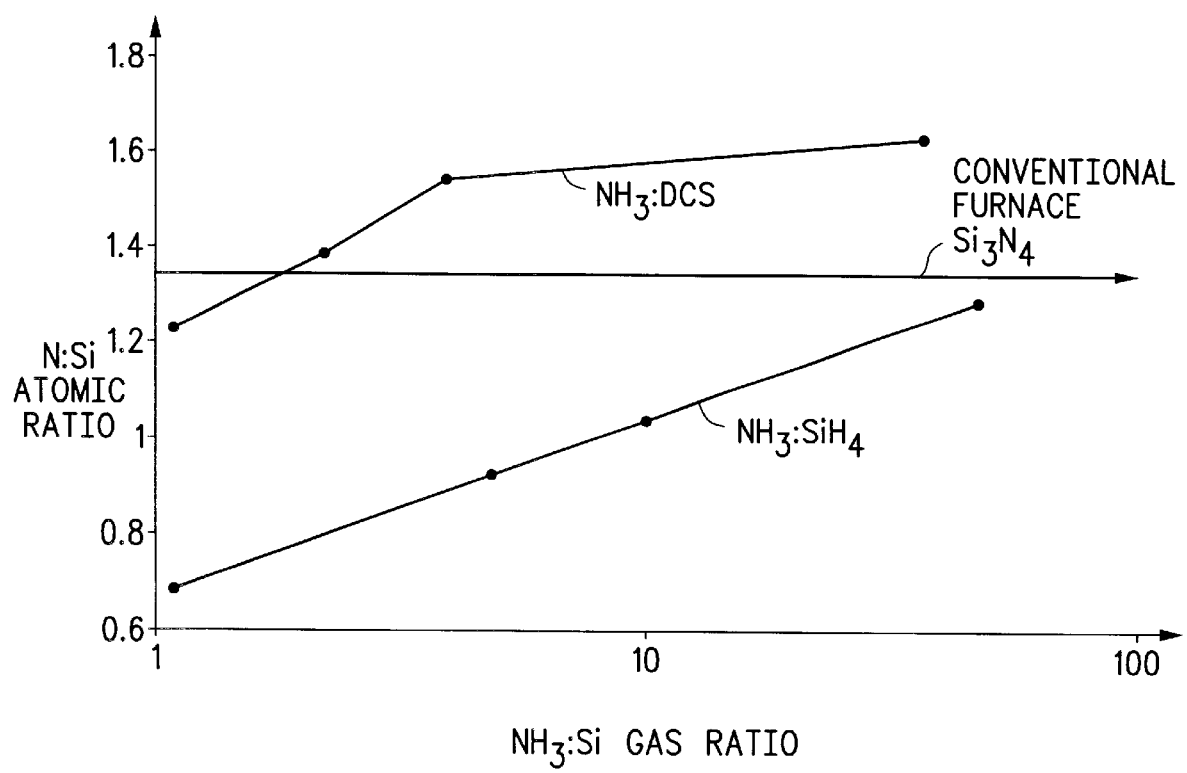
FIG. 15 includes a graph illustrating the nitrogen to silicon atomic ratio within a film compared to the nitrogen source gas to silicon source gas ratio for three different types of deposition systems.
Figure 16:
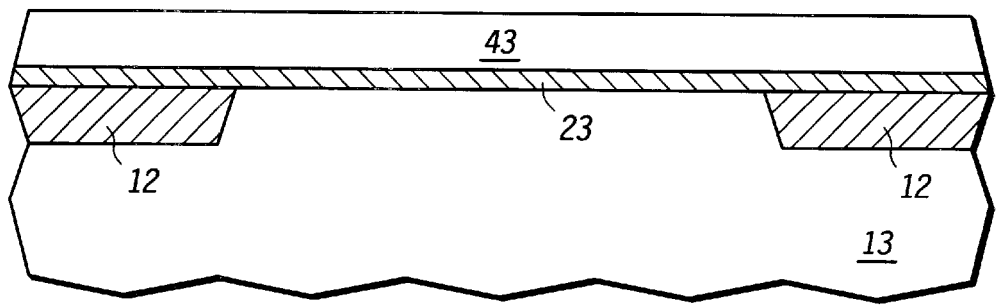
FIG. 16 includes an illustration of a cross-sectional view of the substrate of FIG. 2 after forming a conductive layer over the gate dielectric layer.

FIG. 15 includes a plot of the nitrogen to silicon atomic gas flow ratio for the feed gases versus the nitrogen to silicon atomic ratio within the gate dielectric layer 23. As can be seen in this graph, the composition of a silicon nitride film for a conventional LPCVD process is typically constant over a wide range of feed gas ratios. In the case of a plasma deposition, the ratio of nitrogen to silicon within the gate dielectric layer does vary over the gas ratio, but will not become nitrogen rich until an extremely high nitrogen to silicon gas flow ratio. Unlike the other two processes, the process according to one embodiment of the present invention reaches a nitrogen to silicon ratio greater than 1.5 in the gate dielectric layer 23 at a nitrogen to silicon atomic gas flow ratio (i.e. of the feed gases) at about 3. Typically, the processes are carried out with a gas flow ratio of at least approximately 10:1 to ensure low leakage current through the gate dielectric layer.

A conductive layer 43 is then formed over the gate dielectric layer 23. The conductive layer 43 can include doped silicon, polycide, or even other metal gate materials, such as tungsten, molybdenum, and the like.

Figure 17:
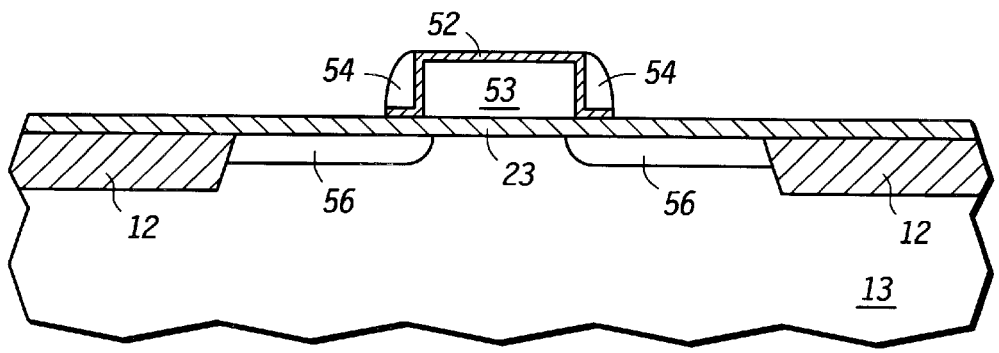
FIG. 17 includes an illustration of a cross-sectional view of the substrate of FIG. 16 after performing a metal insulator semiconductor field effect transistor.

A transistor is formed as illustrated in FIG. 17. The conductive layer 43 (in FIG. 16) is patterned to form gate electrode 53. A protective layer 52 is then formed along sides of the gate electrode 53 and sidewall spacers are formed adjacent to the protective layer 52. Doped region 56 are formed within the substrate 13 to form source and drain regions (i.e. current carrying electrodes). The order of formation of the spacers and doped regions 56 can be varied depending upon the process whether or not regions will be silicided and considerations related to diffusion coefficients and time and heat cycles. The doped regions 56 are typically an opposite conductivity type compared to the substrate. Therefore, in this particular embodiment, the doped regions 56 are heavily n-type doped to a dopant concentration of at least 1E19 atoms per cubic centimeter. The doping species in doped regions 56 includes phosphorous, arsenic, or the like.

Figure 18:
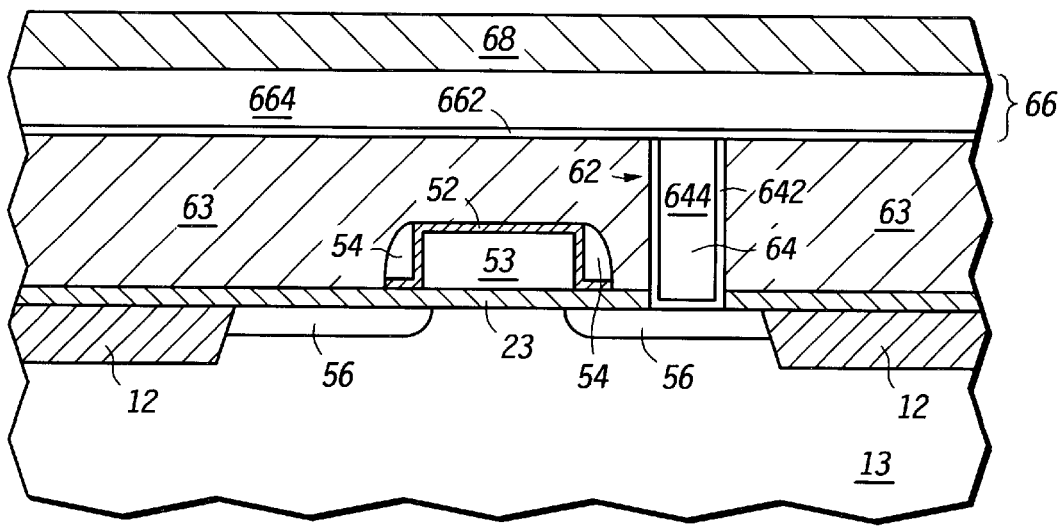
FIG. 18 includes an illustration of a cross-sectional view of the substrate of FIG. 17 after forming a substantially completed device.

Processing is continued to form a substantially completed device as shown in FIG. 18. After forming the transistor an interlevel dielectric layer 63 is then formed and patterned to form a contact opening 62 that extends to one of the doped regions 56. For example, etch chemistry for gate dielectric layer 23 may include phosphoric acid wet etch. A conductive plug 64 is then formed within the contact opening 62. The conductive plug includes an adhesion barrier layer 642 and a conductive fill material 644. The adhesion/barrier layer 642 typically includes titanium/titanium nitride or the like and the conductive fill material 644 is typically tungsten, doped silicon, or the like. A first level interconnect 66 is then formed over the interlevel dielectric layer 63 and the conductive plug 64. The conductive interconnect typically includes an adhesion/barrier layer 662 and a highly conductive film 664, such as aluminum, copper, or the like. A passivation layer 68 is then formed over the interconnect 66 to finish forming a substantially completed device. Clearly, a plurality of insulating films may be included within the interlevel dielectric layer 63 and the passivation layer 68. Other electrical connections are made to the transistor and additional interlevel dielectric layers and interconnects could be formed, if necessary.

The method of forming the gate dielectric layer could also be used in forming a portion or all of the interlevel dielectric layer 63 or the passivation layer 68. Further, since the interlevel dielectric layer is relatively thick, leakage current as seen with the gate dielectric layer is not as much of an issue. Therefore, a nitrogen to silicon gas flow ratio less than 10:1 can be used for interlevel dielectric layers and passivation layers without seriously affecting the performance of the device. The nitrogen to silicon ratio in a range of approximately 3:1 to 10:1 can be used.

Although the previous embodiment of the present invention included using rapid thermal chemical vapor deposition, it should be pointed out that alternate configuration of deposition tools having a high deposition rate and high pressure condition could also be used in forming the film. For a rapid thermal chemical vapor deposition system, the time in the chamber is typically less than one minute. Therefore, the process can be used to form a good high quality robust dielectric layer that can be formed in a relatively quick fashion.

The deposition rate in a rapid thermal chemical vapor deposition is essentially in a range of about 1 angstrom per second up to approximately 10 angstroms per second. It may be difficult to form some interlevel dielectric layers due to their thicknesses, however, this film can be integrated as a polish stop or etch stop within an interlevel dielectric layer to allow proper formation of dual-inlaid interconnects and the like.

In addition to forming transistors for high performance microprocessors and memory cells, such as static-random-access memory cells, the present invention can be used otherwise in applications where drain current is an issue, such as applications that require a device to be used in a battery operated system. Additionally, the dielectric film formed in accordance with the process of the present invention can be used as the capacitor dielectric for the storage capacitors and in the case of a floating gate memory device, it could be used as either a tunnel dielectric or an integrated dielectric layer.

Figure 19:
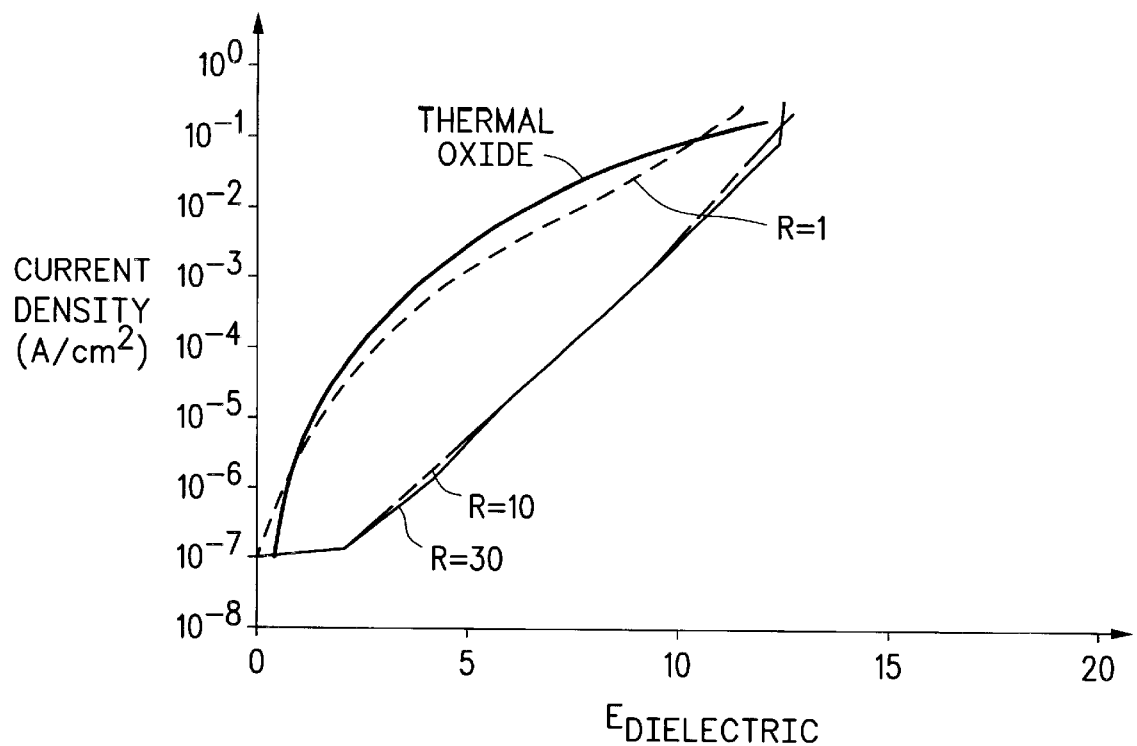
FIG. 19 includes an illustration showing a comparison of current density through a dielectric material versus the electrical field across that dielectric layer.

One of the benefits of the process of using a present invention is to reduce the amount of leakage current density through the gate dielectric layer 23. More specifically, as shown in FIG. 19, a thermal oxide layer does not have a current density less than one microampere per cubic centimeter until you get to an electrical field of less than one megavolt per centimeter. Many devices operate at about five megavolts per centimeter. At five megavolts per centimeter a thermal oxide layer has a current density of about one milliamp per square centimeter. FIG. 19 also shows the differences in gas flow ratios when using a rapid thermal processor. More specifically, a gas flow ratio of one nitrogen atom per one silicon atom in the reacting gases gives a current density plot very similar to that of thermal oxide. Although there is some improvement when the ratio is at least 1:1, the plot of current density versus electrical field is essentially the same as seen for thermal oxide. At approximately five megavolts per centimeter, the current density is about three orders of magnitude less for a 10:1 ratio than for a thermal oxide or a nitride film formed at a ratio of 1:1. Therefore, it can be seen with the plot in FIG. 19 that a process of the present invention can be used to form a gate dielectric layer with good leakage current density characteristics. Increasing the ratio to 30:1 has about the same current density characteristics as a film formed using a 10:1 ratio.

Additionally, the silicon nitride film will be more resistant to boron penetration compared to the thermal dielectric layer and also will not have the hydrogen related trapping problems as seen with conventional $Si_3N_4$ films or PECVD nitrogen-rich SiN layers in the prior art.

Figure 20:
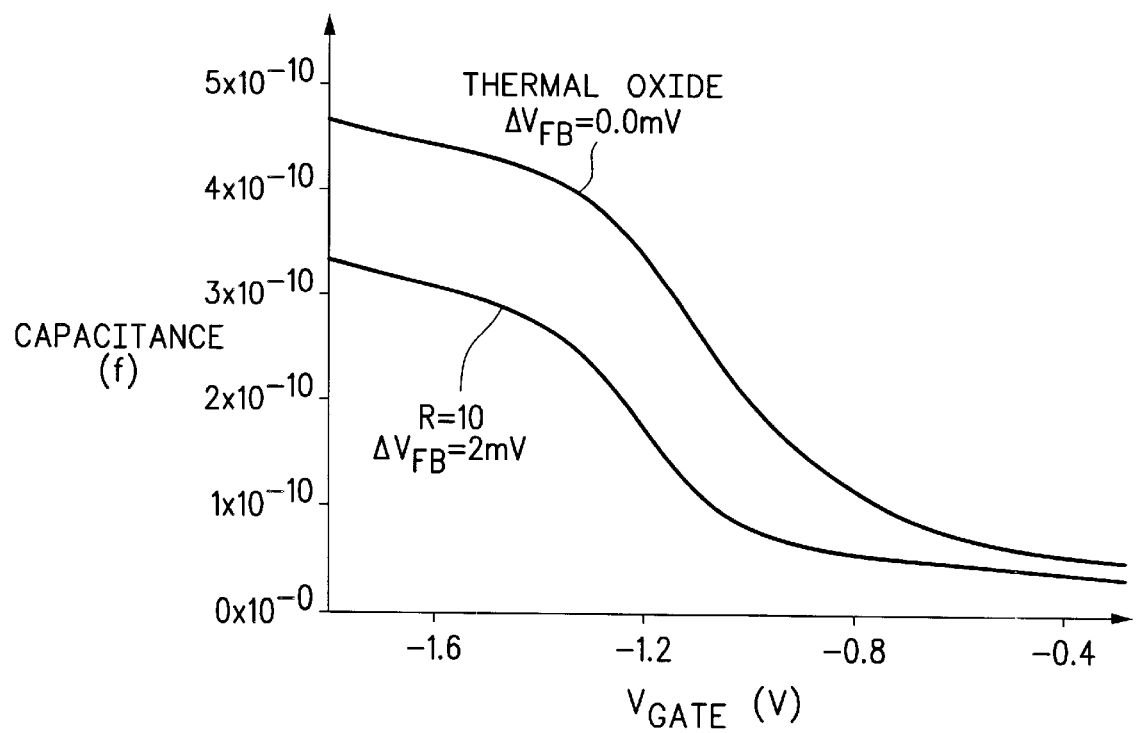
FIG. 20 includes a plot showing capacitance versus gate potential for a conventional thermal oxide and silicon nitride formed by RTCVD using a 10:1 ammonia to DCS gas ratio.

FIG. 20 includes a plot of capacitance versus the voltage applied to the gate. It can be seen with the present invention that the change in flat band voltage is approximately 2 millivolts compared to thermal oxide that has a flatband shift of approximately 0 millivolts. This change in the flat band voltage is not believed to be significant in effecting the performance of the device.

Another benefit of the present invention is that it can be used using currently available materials and equipment. Characterization of new equipment and material is not necessary in order to integrate the process into a production process flow.

Although the invention has been described and illustrated with reference to specific embodiments, it is not intended that the invention be limited to those illustrative embodiments. Those skilled in the art will recognize that modifications and variations may be made without departing from the spirit and scope of the invention. Therefore, it is intended that this invention encompass all of the variations and modifications as fall within the scope of the appended claims.

What is claimed is:

1. A method for forming a gate dielectric, the method comprising:
   loading a semiconductor substrate into a processing chamber of a processing tool;
   sealing the processing tool to form a seal;
   forming a dielectric region containing nitrogen and having a dielectric constant of greater than approximately 5.0 over the semiconductor substrate, wherein the dielectric region is readily oxidizable;
   forming a conductive cap over the dielectric region without breaking the seal, wherein the conductive cap prevents the dielectric region from oxidizing.

2. A method for forming a semiconductor device, the method comprising:
   placing a substrate in a chemical vapor deposition chamber;
   flowing a nitrogen-containing gas and a silicon-containing gas over the substrate;
   depositing a nitrogen-rich silicon nitride film overlying the substrate, wherein depositing is a non-plasma assisted process; and
   removing the substrate from the chemical vapor deposition chamber, wherein processing time elapsed between placing the substrate in the chemical vapor deposition chamber and removing the substrate from the chemical vapor deposition chamber is less than approximately ten minutes.

3. The method of claim 2, wherein depositing is performed at a pressure greater than approximately 1 torr.

4. The method of claim 3, wherein the pressure is in a range of approximately 1 torr to approximately 60 torr.

5. The method of claim 3, wherein depositing is performed at a temperature in a range of approximately 650° C. to approximately 800° C.

6. The method of claim 3, wherein flowing comprises flowing a nitrogen-containing gas and a silicon-containing gas at a gas flow ratio of nitrogen atoms to silicon atoms of at least approximately 10:1.

7. The method of claim 6, wherein the nitrogen-containing gas comprises ammonia.

8. The method of claim 6, wherein the nitrogen-containing gas is selected from a group consisting of: a hydrazine and an organic amine.

9. The method of claim 6, wherein the silicon-containing gas is selected from a group consisting of: a dichlorosilane, a trichlorosilane, and monochlorosilane.

10. The method of claim 2, wherein flowing comprises flowing a nitrogen-containing gas and a silicon-containing gas at a gas flow ratio of nitrogen atoms to silicon atoms of at least approximately 10:1.

11. The method of claim 10, wherein the nitrogen-containing gas comprises ammonia.

12. The method of claim 10, wherein the silicon-containing gas comprises dichlorosilane.

13. The method of claim 10, wherein the nitrogen-rich silicon nitride film forms a gate dielectric layer.

14. The method of claim 13, further comprising:
    forming an interlayer dielectric layer overlying the gate dielectric layer;
    forming an interconnect layer overlying the interlayer dielectric layer; and
    forming a passivation layer overlying the interconnect layer.

15. The method of claim 2, wherein flowing comprises flowing a nitrogen-containing gas and a silicon-containing gas at a gas flow ratio of nitrogen atoms to silicon atoms in a range of approximately 3:1 to approximately 10:1.

16. The method of claim 15, wherein the nitrogen-rich silicon nitride film forms an interlayer dielectric layer.

17. The method of claim 15, wherein the nitrogen-rich silicon nitride film forms a field isolation layer.

18. The method of claim 15, wherein the nitrogen-rich silicon nitride film forms side wall spacers in the semiconductor device.

19. The method of claim 2, wherein depositing is performed in rapid thermal chemical vapor deposition equipment.

20. The method of claim 2, wherein depositing is performed in deposition process equipment configured to operate in a range of 1–60 torr pressure.

21. A method for forming a semiconductor device, the method comprising:
    depositing a gate dielectric layer over a substrate, wherein:
      the gate dielectric layer includes a nitrogen-rich silicon nitride film; and
      depositing is performed as a non-plasma assisted process;
    forming a gate electrode overlying the nitrogen-rich silicon nitride film;
    forming source and drain regions in the substrate;
    forming an interlevel dielectric layer overlying the gate electrode; and
    forming an interconnect layer overlying the interlevel dielectric layer.

* * * * *